United States Patent
Tsai

(10) Patent No.: US 11,988,612 B2
(45) Date of Patent: May 21, 2024

(54) METHODS FOR DETERMINING FOCUS SPOT WINDOW AND JUDGING WHETHER WAFER NEEDS TO BE REWORKED

(71) Applicant: CHANGXIN MEMORY TECHNOLOGIES, INC., Hefei (CN)

(72) Inventor: Meng-Hsuan Tsai, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 266 days.

(21) Appl. No.: 17/653,440

(22) Filed: Mar. 3, 2022

(65) Prior Publication Data
US 2022/0236196 A1    Jul. 28, 2022

Related U.S. Application Data

(63) Continuation of application No. PCT/CN2021/113354, filed on Aug. 18, 2021.

(30) Foreign Application Priority Data

Jan. 26, 2021 (CN) .......................... 202110104698.1

(51) Int. Cl.
*G01N 21/95*    (2006.01)
*G01N 21/88*    (2006.01)
(Continued)

(52) U.S. Cl.
CPC ..... *G01N 21/9501* (2013.01); *G01N 21/8806* (2013.01); *G03F 7/70608* (2013.01); *H01L 22/12* (2013.01)

(58) Field of Classification Search
CPC ............ G01N 21/9501; G01N 21/8806; G03F 7/70608; H01L 22/12
See application file for complete search history.

(56) References Cited

U.S. PATENT DOCUMENTS 5,748,323 A    5/1998 Levinson
6,323,952 B1    11/2001 Yomoto et al.
(Continued)

FOREIGN PATENT DOCUMENTS

CN    1510732 A    7/2004
CN    1661770 A    8/2005
(Continued)

OTHER PUBLICATIONS

International Search Report cited in PCT/CN2021/113354 dated Oct. 26, 2021, 10 pages.
(Continued)

*Primary Examiner* — Hung V Nguyen
(74) *Attorney, Agent, or Firm* — Cooper Legal Group, LLC

(57) ABSTRACT

The present disclosure provides methods for determining a focus spot window of a wafer and judging whether the wafer needs to be reworked, belonging to the field of semiconductor technology. The method for determining a focus spot window of a wafer includes: acquiring flatness information and location information of a local region of the wafer before exposure; acquiring distribution information of abnormal dies, process information corresponding to the abnormal dies, and data information related to wafer yield; and determining the focus spot window corresponding to a process according to the flatness information and the location information of the local region of the wafer, the distribution information of the abnormal dies, the process information corresponding to the abnormal dies, and the data information related to wafer yield.

15 Claims, 7 Drawing Sheets

(51) Int. Cl.
*G03F 7/00* (2006.01)
*H01L 21/66* (2006.01)

(56) References Cited

U.S. PATENT DOCUMENTS

| | | | |
|---|---|---|---|
| 6,918,101 | B1 | 7/2005 | Satya et al. |
| 7,180,586 | B2 * | 2/2007 | Neumann ............ G01N 21/9501 |
| | | | 356/237.5 |
| 7,230,680 | B2 | 6/2007 | Fujisawa et al. |
| 7,301,604 | B2 | 11/2007 | Lin et al. |
| 7,961,763 | B2 * | 6/2011 | Furman ............ G01N 21/95623 |
| | | | 372/30 |
| 10,133,191 | B2 * | 11/2018 | Tel ...................... G03F 7/70625 |
| 11,422,476 | B2 * | 8/2022 | Schmitt-Weaver ..... G03F 7/707 |
| 2013/0182264 | A1 | 7/2013 | Hetzler et al. |
| 2018/0284623 | A1 | 10/2018 | Tel et al. |

FOREIGN PATENT DOCUMENTS

| | | |
|---|---|---|
| CN | 103076722 A | 5/2013 |
| CN | 103140805 A | 6/2013 |
| CN | 108766901 A | 11/2018 |
| CN | 108807204 A | 11/2018 |
| CN | 110517969 A | 11/2019 |
| CN | 111103768 A | 5/2020 |
| CN | 112904679 A | 6/2021 |
| TW | 1657402 B | 4/2019 |
| TW | 202028882 A | 8/2020 |
| WO | 2021244231 A1 | 12/2021 |

OTHER PUBLICATIONS

First Office Action cited in 202110104698.1 dated Feb. 22, 2022, 14 pages.

* cited by examiner

METHODS FOR DETERMINING FOCUS SPOT WINDOW AND JUDGING WHETHER WAFER NEEDS TO BE REWORKED

CROSS-REFERENCE TO RELATED APPLICATIONS

This is a continuation of International Application No. PCT/CN2021/113354, filed on Aug. 18, 2021, which claims the priority to Chinese Patent Application 202110104698.1, titled "METHODS FOR DETERMINING FOCUS SPOT WINDOW AND JUDGING WHETHER WAFER NEEDS TO BE REWORKED" and filed on Jan. 26, 2021. The entire contents of International Application No. PCT/CN2021/113354 and Chinese Patent Application 202110104698.1 are incorporated herein by reference.

TECHNICAL FIELD

The present disclosure relates to the field of semiconductor technology, and in particular, to methods for determining a focus spot window and judging whether a wafer needs to be reworked.

BACKGROUND

During the manufacturing of semiconductors, lithography develops as the core technology of each technology generation. The photolithography refers to a technology of transferring a pattern on a mask to a substrate by virtue of a photoresist under the effect of light. The main process is: first, ultraviolet light is irradiated to the surface of the substrate with a photoresist film through the mask, to cause a chemical reaction of the photoresist in an exposed region; then the photoresist in the exposed region or an unexposed region (the former is called a positive photoresist, and the latter is called a negative photoresist) is dissolved and removed by development technology, so that the pattern on the mask is transferred to the photoresist film; finally, the pattern is transferred to the substrate by etching technology.

Focus spot window control is an important consideration of lithography technology, and is directly related to the yield and production efficiency of semiconductor products. At present, in the photolithography technology, different focus spot windows are set for different machines. However, the setting of focus spot windows for different machines only cannot achieve higher yield of semiconductor products.

It should be noted that the information disclosed in the background section above is only used to enhance the understanding of the background of the present disclosure, and therefore may include information that does not constitute the prior art known to those of ordinary skill in the art.

SUMMARY

According to an aspect of the embodiments of the present disclosure, a method for determining a focus spot window of a wafer, including:

acquiring flatness information and location information of a local region of the wafer before exposure;

acquiring distribution information of abnormal dies, process information corresponding to the abnormal dies, and data information related to wafer yield; and determining a focus spot window corresponding to a process according to the flatness information and the location information of the local region of the wafer, the distribution information of the abnormal dies, the process information corresponding to the abnormal dies, and the data information related to wafer yield.

It should be understood that the above general description and the following detailed description are only exemplary and explanatory, and cannot limit the present disclosure.

BRIEF DESCRIPTION OF THE DRAWINGS

The accompanying drawings herein are incorporated into the specification and constitute a part of the specification, show embodiments consistent with the present disclosure, and are used to explain the principle of the present disclosure together with the specification. Apparently, the drawings described below are only some of the drawings of the present disclosure, and other drawings may also be obtained by those of ordinary skill in the art according to these drawings without any creative efforts.

DETAILED DESCRIPTION

Figure 1:
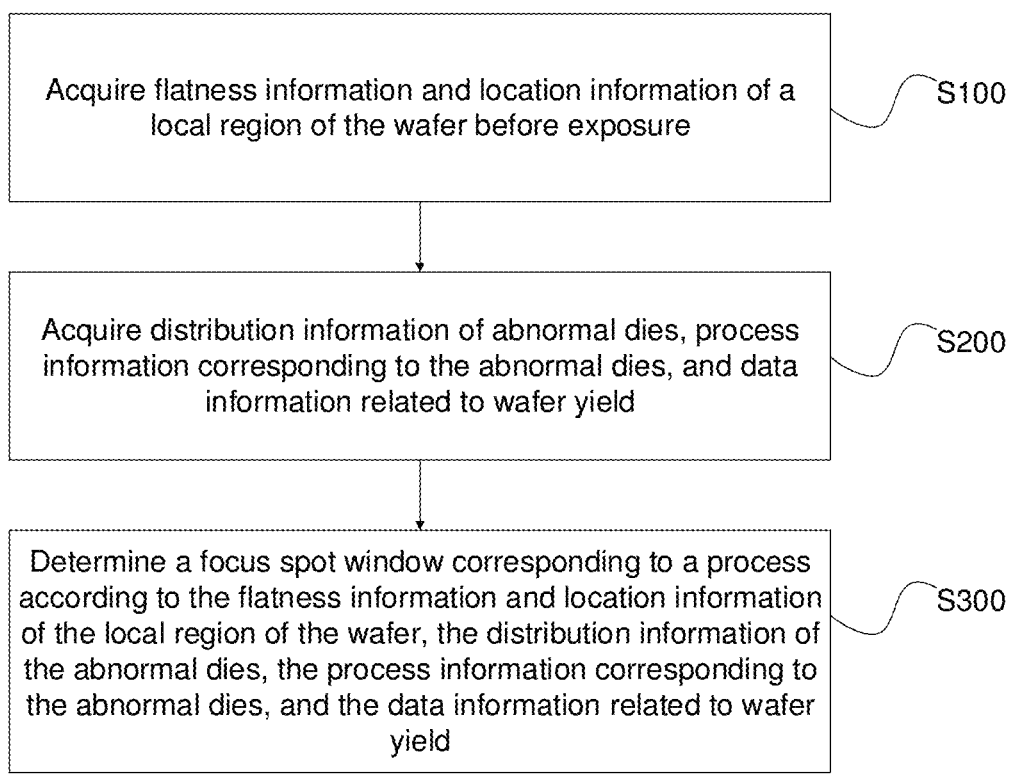
FIG. 1 is a schematic flowchart of a method for determining a focus spot window of a wafer in an exemplary embodiment of the present disclosure.

Example embodiments are now described more comprehensively with reference to the accompanying drawings. However, the example embodiments can be implemented in various forms, and should not be construed as being limited to the examples set forth herein; on the contrary, the provision of these embodiments makes the present disclosure more comprehensive and complete, and fully conveys the concept of the example embodiments to those skilled in the art. The same reference numerals in the figures indicate the same or similar structures, and thus their detailed descriptions will be omitted. In addition, the drawings are only schematic illustrations of the present disclosure, and are not necessarily drawn to scale.

The described features, structures or characteristics can be combined in one or more embodiments in any suitable way. In the following description, many specific details are provided to provide a sufficient understanding of the embodiments of the present disclosure. However, those skilled in the art would realize that the technical solutions of the present disclosure can be practiced without one or more of the specific details, or other methods, components, materials, etc. can be used. In other cases, well-known structures, materials or operations are not shown or described in detail to avoid obscuring the main technical ideas of the present disclosure.

The terms "one", "a", and "the" are used to indicate the presence of one or more elements/components/etc. The terms "include" and "have" are used to indicate open inclusion and indicate that there may be additional elements/components/etc. in addition to the listed elements/components/etc. The terms "first" and "second" are only used as markers and are not a restriction on the number of objects.

As shown in FIG. 1, an embodiment of the present disclosure provides a method for determining a focus spot window of a wafer, including:

Step S100, acquiring flatness information and location information of a local region of the wafer before exposure;

Step S200, acquiring distribution information of abnormal dies, process information corresponding to the abnormal dies, and data information related to wafer yield; and Step S300, determining a focus spot window corresponding to a process according to the flatness information and the location information of the local region of the wafer, the distribution information of the abnormal dies, the process information corresponding to the abnormal dies, and the data information related to wafer yield.

The method for determining a focus spot window of a wafer provided by the present disclosure includes: acquiring flatness information and location information of a local region of the wafer before exposure, as well as distribution information of the abnormal dies, process information corresponding to the abnormal dies, and data information related to wafer yield; and finally, obtaining the focus spot window corresponding to the process by combining the flatness information of the local region of the wafer, the data information related to wafer yield, and the process information corresponding to the abnormal dies. The method for determining a focus spot window of a wafer provided by the present disclosure can determine corresponding focus spot window for the process in the lithography technology, so that the focus spot control is more delicate in the entire process of semiconductor lithography technology, which further improves product yield.

Hereinafter, the steps in the method for determining a focus spot window of a wafer provided by the embodiments of the present disclosure will be described in detail with reference to the accompanying drawings:

Step S100, flatness information and location information of a local region of the wafer before exposure are acquired.

The flatness information of the wafer is data information that represents ups and downs on the surface of the wafer.

In the semiconductor integrated circuit manufacturing technology, with the continuous improvement on the integration of semiconductor integrated circuits and the development of semiconductor technology, the sizes of semiconductors continue to decrease, and their critical dimensions become smaller and smaller. In the photolithography process, in order to obtain an accurate pattern, photolithography exposure need to be performed at the best focal length to minimize the probability of de-focusing. The flatness of the wafer is an important factor affecting the probability of de-focusing. When the flatness of a certain local region of the wafer exceeds a certain limit, the pattern will be de-focused during photolithography exposure, which will affect product yield.

Figure 8:
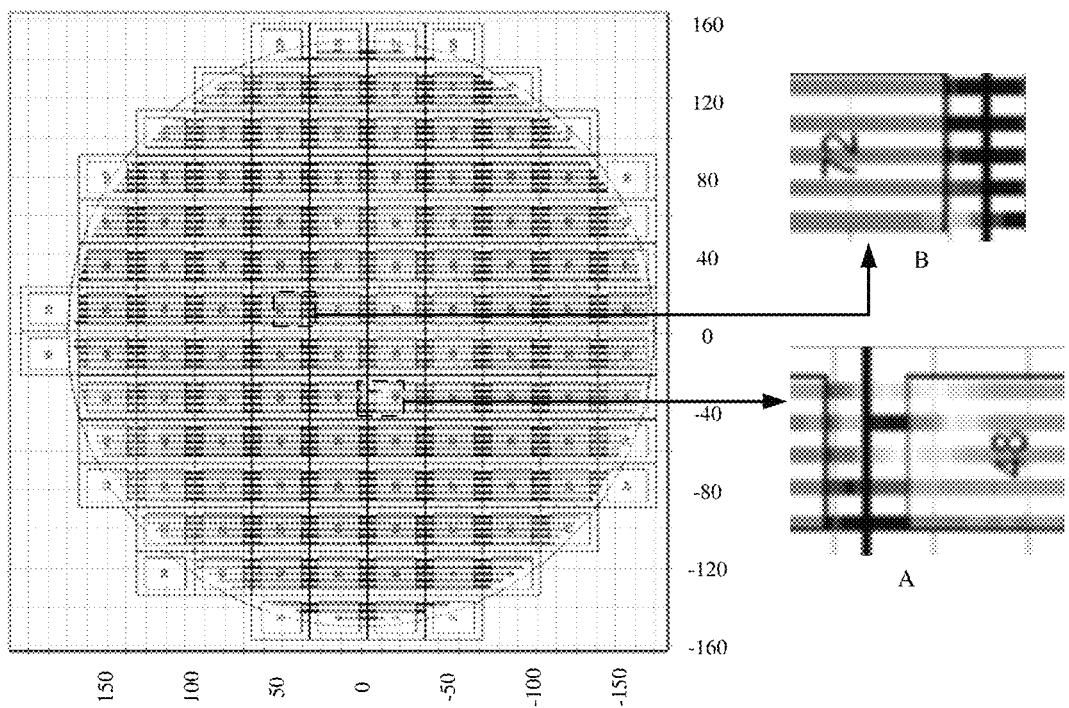
FIG. 8 is a diagram showing scan results of wafer flatness in an exemplary embodiment of the present disclosure.

In some embodiments of the present disclosure, before the wafer is exposed, a measuring end of a photolithography machine scans and measures the surface topography of the wafer to obtain information about ups and downs on the surface of the wafer, that is, the flatness information of the wafer. It should be noted here that the scanning mode for acquiring the flatness information of the wafer may be set according to the actual situation, for example, an "S"-shaped scanning mode scans the wafer from top to bottom, and then from bottom to top. Of course, other scanning modes may also be used, which is not specifically limited. In addition, the specific representation form of the flatness information of the wafer is also not limited. Different measuring terminals or different operators calculate the flatness of a wafer in different ways, and the specific representation form is also different. The present disclosure does not limit this, as long as the flatness can represent ups and downs on the surface of the wafer. In some embodiments of the present disclosure, a wafer surface topography map may be obtained by scanning and measuring the surface topography of the wafer. As shown in FIG. 8, the obtained wafer surface topography map includes abscissa and ordinate, which are used to represent the location information of the local region. In this figure, the ups and downs on the surface of the wafer are displayed in different colors. For details, refer to the local region marked with 48 in the small box in FIG. 8. In this figure, different color shades represent different flatness.

In the present disclosure, the flatness information and the location information of the local region of the wafer refer to the flatness information of the local region of the wafer and the location information corresponding to the local region. For example, if the flatness of the local region of the wafer is represented by a height h, and the location information of the local region is represented by two-dimensional coordinates (x, y), the flatness information and the location information of the local region of the wafer include the height h of the local region and the two-dimensional coordinates (x, y) corresponding to the local region. It should be noted that the flatness information and the location information in the present disclosure may be represented in a variety of forms. The above example is merely illustrative of the content included in the flatness information and the location information of the local region of the wafer in the present disclosure, and the specific content does not limit the present disclosure.

In step S200, distribution information of abnormal dies, process information corresponding to the abnormal dies, and data information related to wafer yield are acquired.

Figure 9:
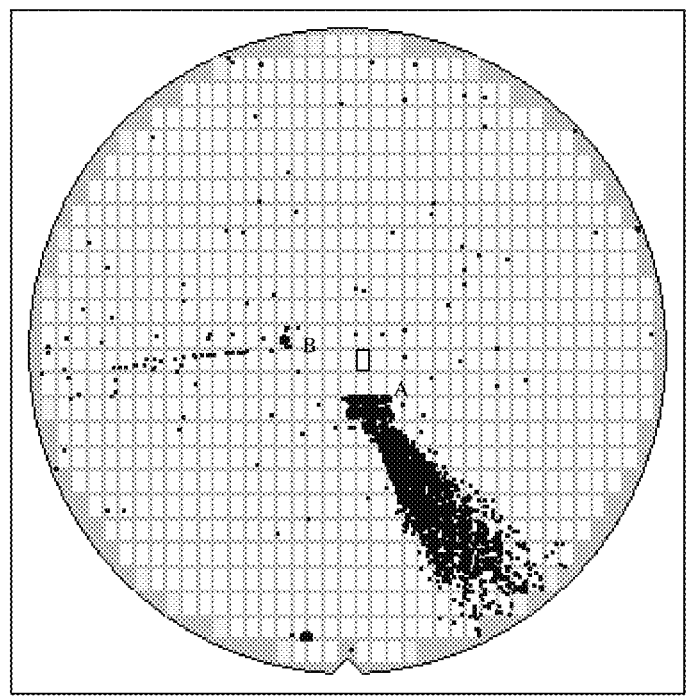
FIG. 9 is a diagram showing scan results of wafer defects in an exemplary embodiment of the present disclosure.

The wafer includes a plurality of dies, and various defects formed during the manufacturing of the wafer may cause unqualified dies, that is, abnormal dies. As shown in FIG. 9, the regions marked in black represent abnormal dies. In some embodiments of the present disclosure, the distribution information of abnormal dies may include the location information of the abnormal dies, and may also include a number of the abnormal dies. The process information of the abnormal dies refers to specific processes that cause the abnormal dies.

The data information related to wafer yield may include wafer yield calculation methods, specific yield data values, or other data values that can represent wafer yield, such as a loss rate or a defect rate. Since the wafer includes a plurality of dies, whether the dies are qualified or not is an important indicator that affects the wafer yield. The wafer yield may be represented by a ratio of the number of qualified dies to the total number of dies. In the present disclosure, the loss rate or defect rate refers to a ratio of the number of unqualified dies to the total number of dies. The sum of the wafer yield and the wafer loss rate (defect rate) is 1. The data information related to wafer yield may correspond to the process, and the yield, loss rate or defect rate of the wafer is different under the different processes. In some embodiments of the present disclosure, the data information related to wafer yield includes a loss rate or a defect rate.

In some embodiments of the present disclosure, the distribution information of the abnormal dies, the process information corresponding to the abnormal dies, and the data information related to wafer yield may be acquired according to a wafer yield information database. The wafer yield information database refers to historical data of wafers tested in the past. Based on the historical data, engineers can determine a focus spot window corresponding to the process through the method provided in the present disclosure, thereby improving the yield of products.

In the semiconductor manufacturing process, the wafer yield is an important indicator of product quality. In some embodiments of the present disclosure, the wafer yield information database may include a variety of data information, such as wafer structure information, wafer defect scan data information, and data information related to wafer yield. The wafer structure information may include wafer area, a number of dies in the wafer or location information of the dies, etc.; the wafer defect scan data information may include overall defect information of the wafer and defect data of each region in the wafer, etc.; the data information related to wafer yield refers to related data that represents wafer yield, which may include a wafer yield test result map, wafer yield calculation methods, specific yield data values or other data values that can represent wafer yield, such as a loss rate or a defect rate.

Figure 10:
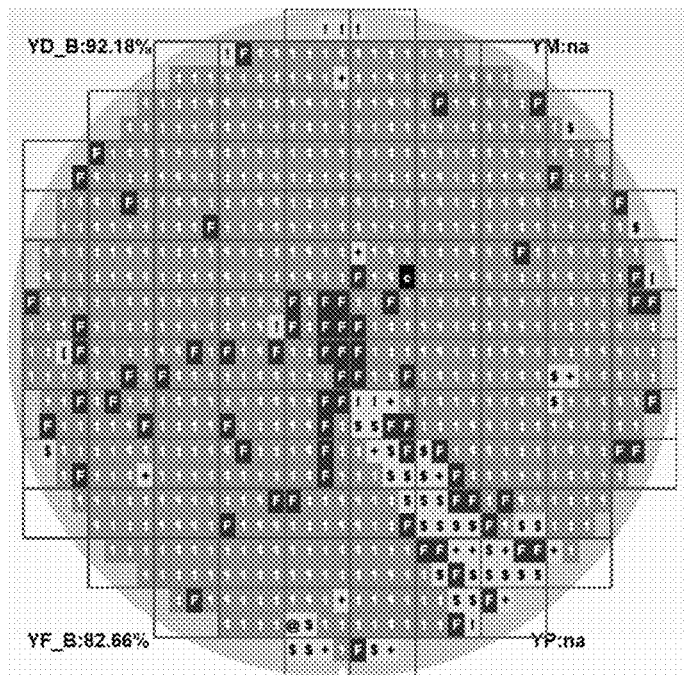
FIG. 10 is a diagram showing wafer yield test results in an exemplary embodiment of the present disclosure.

During actual operation, the wafer yield information database may be obtained by a variety of test systems or test methods. For example, in the wafer manufacturing process, the wafer is scanned and analyzed for defects at different process sites to obtain corresponding defect data information, or the wafer is tested, such as tested for electrical property, to obtain data information related to wafer yield. For example, in the photolithography technology, for different process nodes, such as exposure and etching at different layers of the wafer, defect scanning analysis may be performed on the wafer to obtain wafer defect data information. The wafer defect data information may include wafer model, process site or process node, area and location information of each region of the wafer, defect type, defect name, defect quantity, etc., and may further include data information such as defect density. The defect type refers to different types of defects, such as protruding defects or recessed defects, and the defect quantity refers to a number of each type of defects. The defect density refers to a ratio of the number of defects in a certain region of the wafer to the area of the region. In some embodiments of the present disclosure, a wafer defect distribution map may be obtained by defect scanning on the wafer, as shown in FIG. 9. In the figure, the regions marked in black are defect regions. A wafer yield result map may be obtained by testing the wafer, as shown in FIG. 10. In the figure, the region marked in "1" represents the best test result in this region, indicating that the test in this region is qualified. Other symbol marks represent defects in the regions tested, and different symbols may represent different types of defects. The specific mark symbols and defect types may be determined by a test system. Engineers can analyze the reason for the failure of a certain region of the wafer based on the wafer yield result map, and further analyze the map to obtain corresponding specific processes. It should be noted here that FIGS. 9 and 10 only exemplarily illustrate the information that the wafer yield information database of the present disclosure may include, and the specific content in the figures does not limit the present disclosure.

In step S300, a focus spot window corresponding to a process is determined according to the flatness information and the location information of the local region of the wafer, the distribution information of the abnormal dies, the process information corresponding to the abnormal dies, and the data information related to wafer yield.

In this step, a focus spot window corresponding to the process is obtained by combining the flatness information of the local region of the wafer, the data information related to wafer yield, and the process information corresponding to the abnormal dies, so that the focus spot control is more delicate in the entire process of semiconductor lithography technology, which further improves product yield. In this step, the flatness information and the location information of the local region of the wafer are matched with the distribution information of the abnormal dies to determine a corresponding relation between the flatness of the local region and the abnormal dies, and are combined with the process information corresponding to the abnormal dies and the data information related to wafer yield under the process to obtain a focus spot window corresponding to the process.

Figure 3:
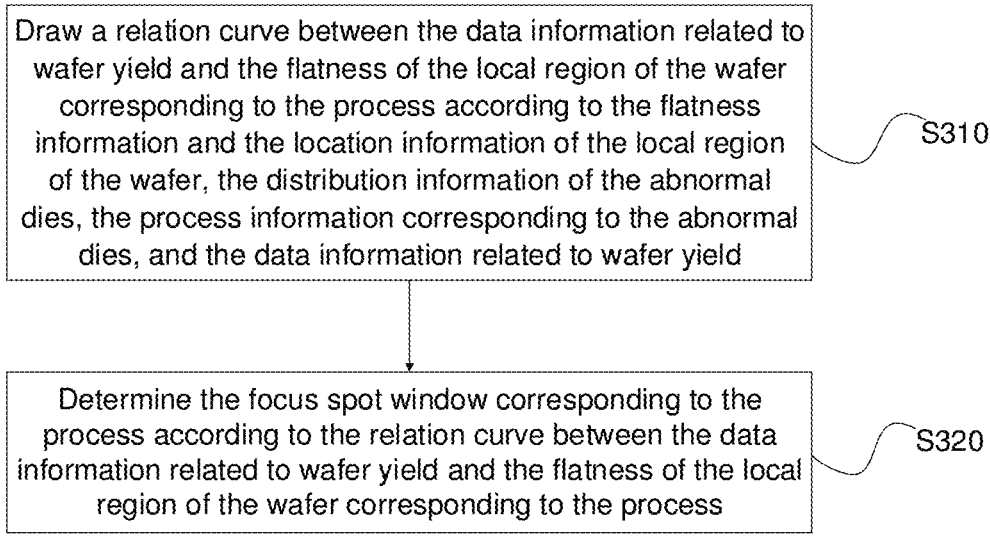
FIG. 3 is a schematic step flowchart of the method for determining a focus spot window of a wafer in an exemplary embodiment of the present disclosure.

As shown in FIG. 3, in some embodiments of the present disclosure, step S300 includes:

Step S310, drawing a relation curve between the data information related to wafer yield and the flatness of the local region of the wafer corresponding to the process according to the flatness information and the location information of the local region of the wafer, the distribution information of the abnormal dies, the process information corresponding to the abnormal dies, and the data information related to wafer yield;

Step S320, determining the focus spot window corresponding to the process according to the relation curve between the data information related to wafer yield and the flatness of the local region of the wafer corresponding to the process.

In step S310, a relation curve between the data information related to wafer yield and the flatness of the local region of the wafer corresponding to the process is drawn according to the flatness information and the location information of the local region of the wafer, the distribution information of the abnormal dies, the process information corresponding to the abnormal dies, and the data information related to wafer yield.

In the semiconductor integrated circuit manufacturing technology, when the flatness of a certain local region of the wafer exceeds a certain limit, the pattern will be de-focused during photolithography exposure, which will affect wafer yield. In this step, the flatness information and the location information of the local region of the wafer are matched with the distribution information of the abnormal dies to determine a corresponding relation between the flatness of the local region and the abnormal dies. In addition, when the flatness of a certain region of the wafer exceeds a certain limit, the influence of the flatness of this region on the wafer yield may be preliminarily determined based on the distribution information of the abnormal dies. The distribution information of the abnormal dies includes the location information of the abnormal dies, and may further include a number of the abnormal dies. For example, as shown in FIGS. 8 and 9, when the flatness of region A in FIG. 8 exceeds a certain limit, abnormal dies will appear in this region, specifically shown by the region marked in black in FIG. 9. Comparing the two figures, it can be seen that when the flatness of the region A exceeds a certain limit, the abnormal dies in this region are distributed radially, indicating a relatively large impact on the wafer yield when the flatness of this region exceeds a certain limit. When the flatness of region B in FIG. 8 exceeds a certain limit, the abnormal dies in this region appear radially lower than that of region A, indicating a lower impact on the wafer yield than the region A when the flatness of this region exceeds a certain limit. According to this information, when the flatness of a local region exceeds a certain limit, engineers can formulate different countermeasures for different regions, such as rework or die back removal.

Figure 11:
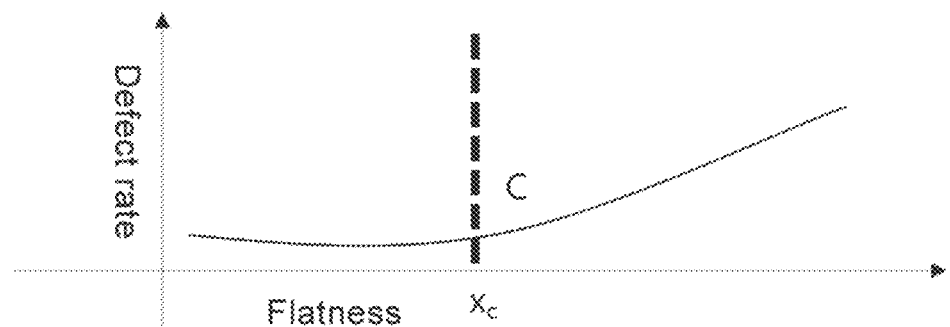
FIG. 11 is a curve diagram showing a relation between data information related to wafer yield and flatness of a local region of the wafer in an exemplary embodiment of the present disclosure.

In this step, a relation curve between the data information related to wafer yield and the flatness of the local region of the wafer corresponding to the process is drawn. The data information related to wafer yield may include specific wafer yield data values or other data values that can represent wafer yield, such as a loss rate or a defect rate. In some embodiments of the present disclosure, the data information related to wafer yield is a defect rate. FIG. 11 shows a relation curve between the wafer defect rate and the flatness of the local region of the wafer, in which the abscissa is the flatness of the local region of the wafer, and the ordinate is the defect rate. As the flatness increases, the defect rate of the wafer gradually increases. It should be noted that, in addition to the relation curve between the wafer defect rate and the flatness of the local region of the wafer, a relation curve between the wafer yield and the flatness of the local region of the wafer may also be drawn.

In step S320, the focus spot window corresponding to the process is determined according to the relation curve between the data information related to wafer yield and the flatness of the local region of the wafer corresponding to the process.

In this step, a focus spot window corresponding to the process may be determined according to the change trend of the relation curve between the data information related to wafer yield and the flatness of the local region of the wafer corresponding to the process.

Figure 4:
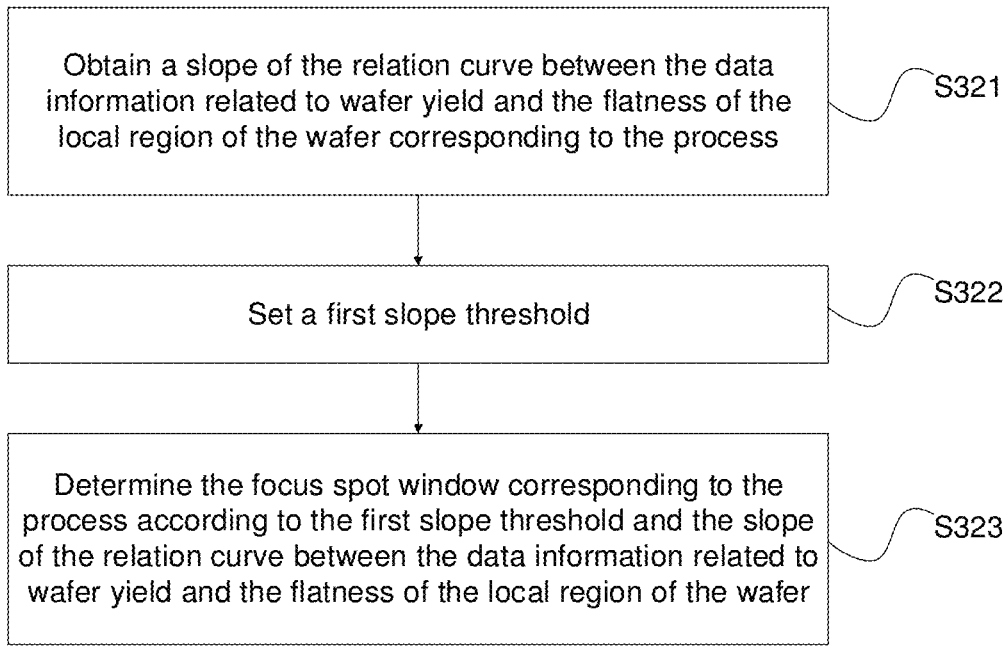
FIG. 4 is a schematic step flowchart of the method for determining a focus spot window of a wafer in another exemplary embodiment of the present disclosure.

As shown in FIG. 4, in some embodiments of the present disclosure, step S320 includes:

Step S321, obtaining a slope of the relation curve between the data information related to wafer yield and the flatness of the local region of the wafer corresponding to the process;

Step S322, setting a first slope threshold;

Step S323, determining the focus spot window corresponding to the process according to the first slope threshold and the slope of the relation curve between the data information related to wafer yield and the flatness of the local region of the wafer.

In step S321, a slope of the relation curve between the data information related to wafer yield and the flatness of the local region of the wafer corresponding to the process is obtained. In the present disclosure, the slope of the relation curve between the data information related to wafer yield and the flatness of the local region of the wafer refers to a tangent slope at a certain point on the curve. The tangent slopes at different points on the curve are different.

In step S322, a first slope threshold is set. The first slope threshold is a set slope limit value. The value may be set based on experience or historical data, and the specific value is not limited.

In step S323, the focus spot window corresponding to the process is determined according to the first slope threshold and the slope of the relation curve between the data information related to wafer yield and the flatness of the local region of the wafer. In this step, once the first slope threshold is set, the focus spot window can be determined according to the threshold combined with the change trend of the slope of the relation curve between the data information related to wafer yield and the flatness of the local region of the wafer. In some embodiments of the present disclosure, the data information related to wafer yield is a wafer defect rate, and the first slope threshold is 1. When the slope of the relation curve between the data information related to wafer yield and the flatness of the local region of the wafer is equal to the first slope threshold, the corresponding flatness of the local region of the wafer is a focus spot window. As shown in FIG. 11, the slope of the curve at point C is 1, and the corresponding flatness xc at this point is a focus spot window. It should be noted here that this figure shows a relation curve between data information related to wafer yield and flatness of a local region of the wafer in a certain process, which only schematically illustrates the method for determining a focus spot window, and the specific process is not limited. Different processes correspond to different relation curves, and different focus spot windows can be correspondingly obtained through this step.

Figure 2:
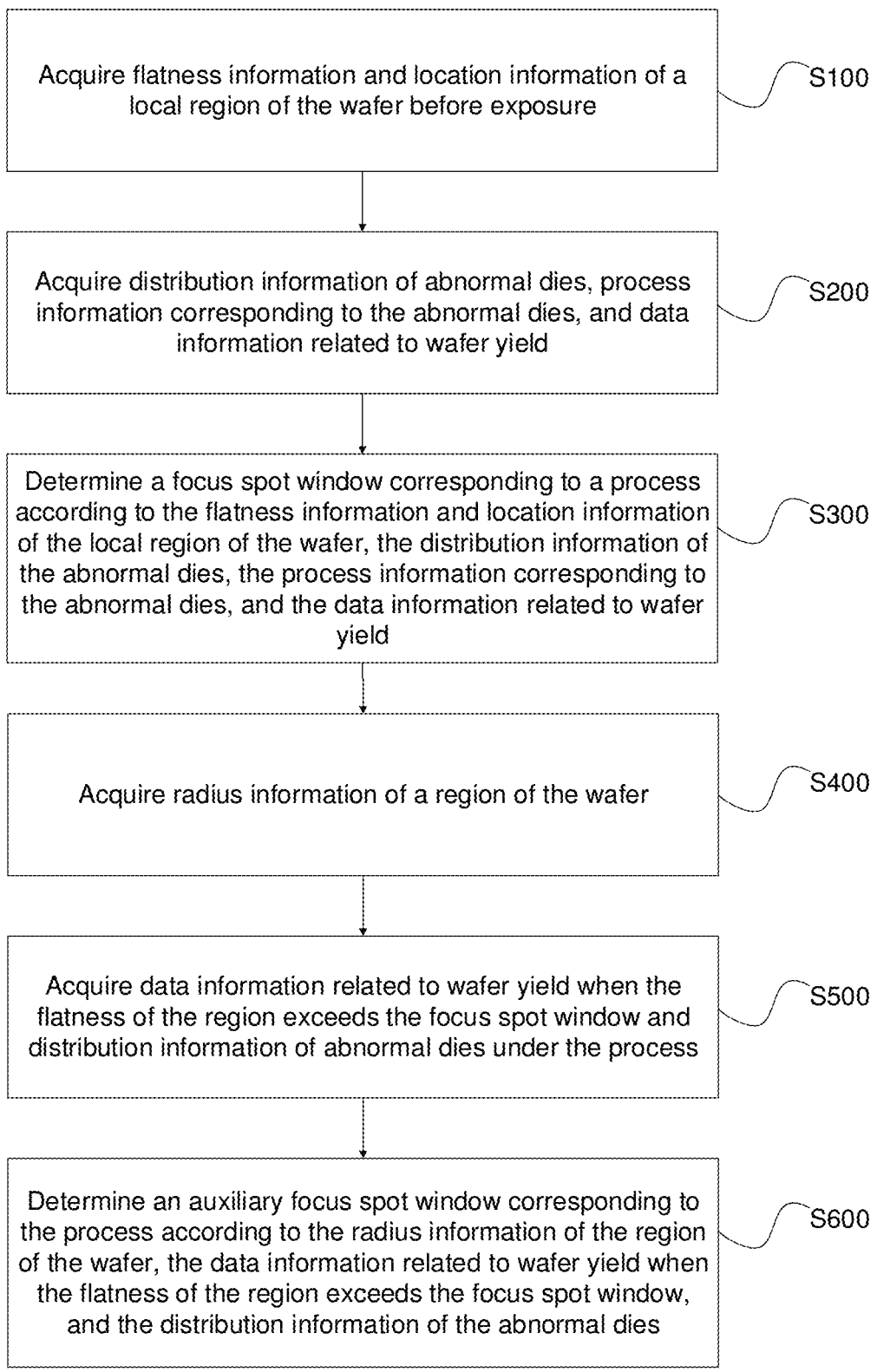
FIG. 2 is a schematic flowchart of a method for determining a focus spot window of a wafer in another exemplary embodiment of the present disclosure.

As shown in FIG. 2, in some embodiments of the present disclosure, the method for determining a focus spot window of a wafer provided by the present disclosure further includes:

Step S400, acquiring radius information of a region of the wafer;

Step S500, acquiring data information related to wafer yield when the flatness of the region exceeds the focus spot window and distribution information of the abnormal dies under the process;

Step S600, determining an auxiliary focus spot window corresponding to the process according to the radius information of the region of the wafer, the data information related to wafer yield when the flatness of the region exceeds the focus spot window, and the distribution information of the abnormal dies.

Figure 5:
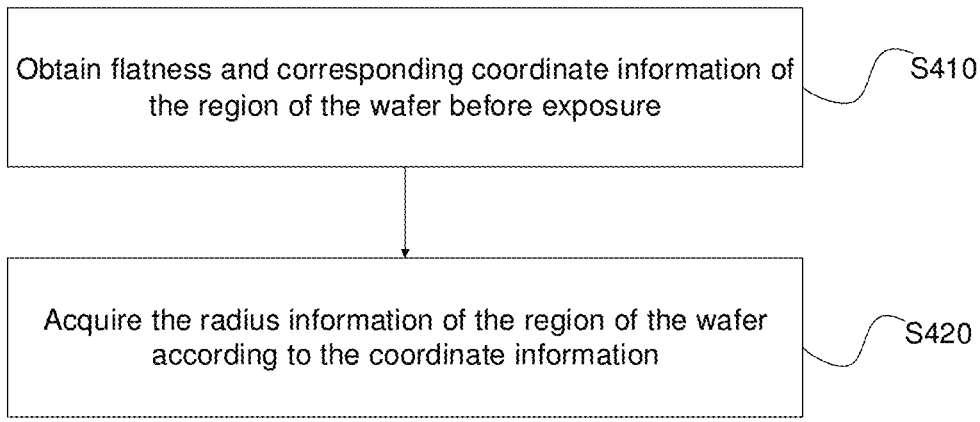
FIG. 5 is a schematic step flowchart of the method for determining a focus spot window of a wafer in still another exemplary embodiment of the present disclosure.

As shown in FIG. 5, in step S400, the radius information of the region of the wafer may be acquired according to the coordinate information of the region.

In some exemplary embodiments of the present disclosure, step S400 includes:

Step S410, obtaining flatness and corresponding coordinate information of the region of the wafer before exposure;

Step S420, acquiring the radius information of the region of the wafer according to the coordinate information.

In the present disclosure, two-dimensional coordinates (x, y) may be used to represent the coordinate information of the region of the wafer, and the radius information of the region of the wafer may be calculated according to the two-dimensional coordinate information. Further, in some embodiments, the center point of the wafer is an origin of two-dimensional coordinates.

In steps S400 and S500, radius information of the region of the wafer is acquired; and data information related to wafer yield when the flatness of the region exceeds the focus spot window and distribution information of the abnormal dies under the process are acquired.

In the same semiconductor process, when the flatness of the region of the wafer exceeds the focus spot window, the impact on the wafer is different. For example, in a certain process, when the flatness of a center region of the wafer exceeds the focus spot limit, radial abnormal dies will be formed in this region, which has a relatively large impact on the yield of the wafer; and when the flatness of a window region of the wafer exceeds the focus spot limit, radial abnormal dies will not be formed, which has a relatively small impact on the yield of the wafer. For this type of process, after the focus spot window is determined, other windows need to be further determined.

In some embodiments of the present disclosure, the radius information of the wafer is used to represent the region, and the data information related to wafer yield when the flatness of a region exceeds the focus spot window and the distribution information of the abnormal dies are acquired, so as to further determine other windows.

In step S600, the auxiliary focus spot window corresponding to the process is determined according to the radius information of the region of the wafer, the data information related to wafer yield when the flatness of the region exceeds the focus spot window, and the distribution information of the abnormal dies.

In this step, the radius information of the region of the wafer in the process is combined with the data information related to wafer yield and the abnormal dies distribution information of this region to determine the auxiliary focus spot window corresponding to the process.

Figure 6:
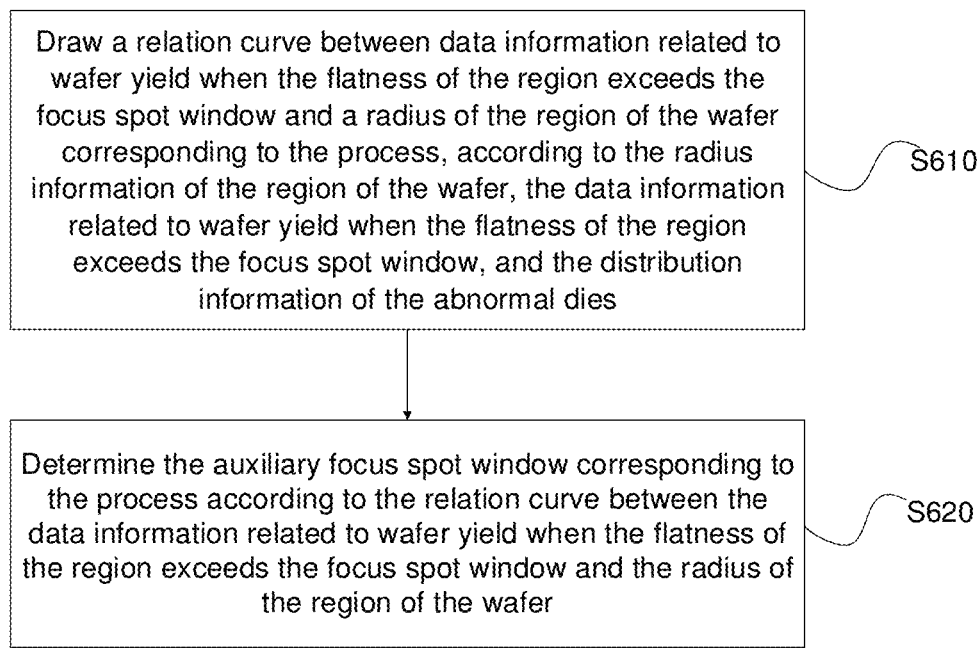
FIG. 6 is a schematic step flowchart of the method for determining a focus spot window of a wafer in still another exemplary embodiment of the present disclosure.

As shown in FIG. 6, in some embodiments of the present disclosure, step S600 includes:

Step S610, drawing a relation curve between data information related to wafer yield when the flatness of the region exceeds the focus spot window and a radius of the region of the wafer corresponding to the process, according to the radius information of the region of the wafer, the data information related to wafer yield when the flatness of the region exceeds the focus spot window, and the distribution information of the abnormal dies.

Step S620, determining the auxiliary focus spot window corresponding to the process according to the relation curve between the data information related to wafer yield when the flatness of the region exceeds the focus spot window and the radius of the region of the wafer.

In step S610, drawing a relation curve between data information related to wafer yield when the flatness of the region exceeds the focus spot window and radius of the region of the wafer corresponding to the process, according to the radius information of the region of the wafer, the data information related to wafer yield when the flatness of the region exceeds the focus spot window, and the distribution information of the abnormal dies.

Figure 12:
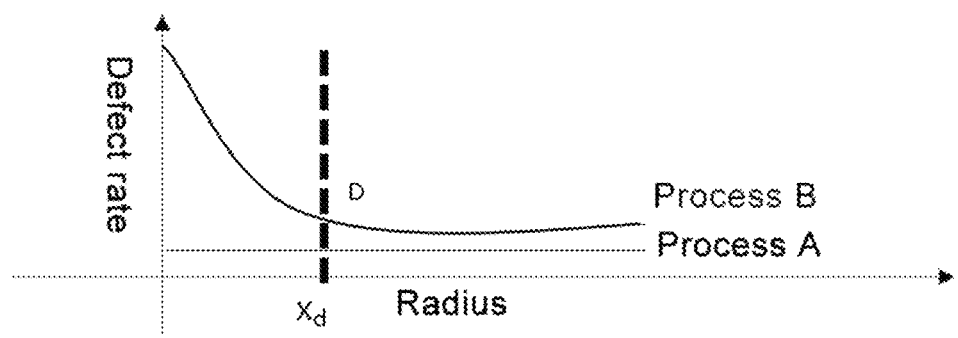
FIG. 12 is a curve diagram showing a relation between data information related to wafer yield when the flatness of a region exceeds the focus spot window corresponding to a process and radius of the region of the wafer in an exemplary embodiment of the present disclosure.

The data information related to wafer yield may include specific wafer yield data values or other data values that can represent wafer yield, such as a loss rate or a defect rate. In some embodiments of the present disclosure, the data information related to wafer yield when the flatness of the region exceeds the focus spot window is a defect rate. FIG. 12 shows a relation curve between the wafer defect rate when the flatness of the region exceeds the focus spot window and the radius of the region of the wafer, in which the abscissa is the radius of the region of the wafer, and the ordinate is the defect rate. In this figure, the curve in light color represents a relation curve between the wafer defect rate of the A process and the radius of the region of the wafer, and the curve in dark color represents a relation curve between the wafer defect rate of the B process and the radius of the region of the wafer. It can be seen from the figure that for the A process, when the flatness of the region of the wafer exceed the focus spot window, the impact on the wafer is basically the same; and for the B process, when the flatness of the region of the wafer exceeds the focus spot window, a different impact is produced on the wafer. Therefore, the auxiliary focus spot window may not be considered for the A process, and but need to be further determined for the B process. The distribution information of the abnormal dies may assist in determining the impact on the wafer when the flatness of the region of the wafer exceeds the focus spot window under the process. It should be noted that, in addition to the relation curve between the wafer defect rate and the radius of the region of the wafer, a relation curve between the wafer yield and the radius of the region of the wafer may also be drawn.

In step S620, the auxiliary focus spot window corresponding to the process is determined according to the relation curve between the data information related to wafer yield when the flatness of the region exceeds the focus spot window and the radius of the region of the wafer.

In this step, the auxiliary focus spot window corresponding to the process may be determined according to the change trend of the relation curve between the data information related to wafer yield when the flatness of the region exceeds the focus spot window and the radius of the region of the wafer corresponding to the process.

Figure 7:
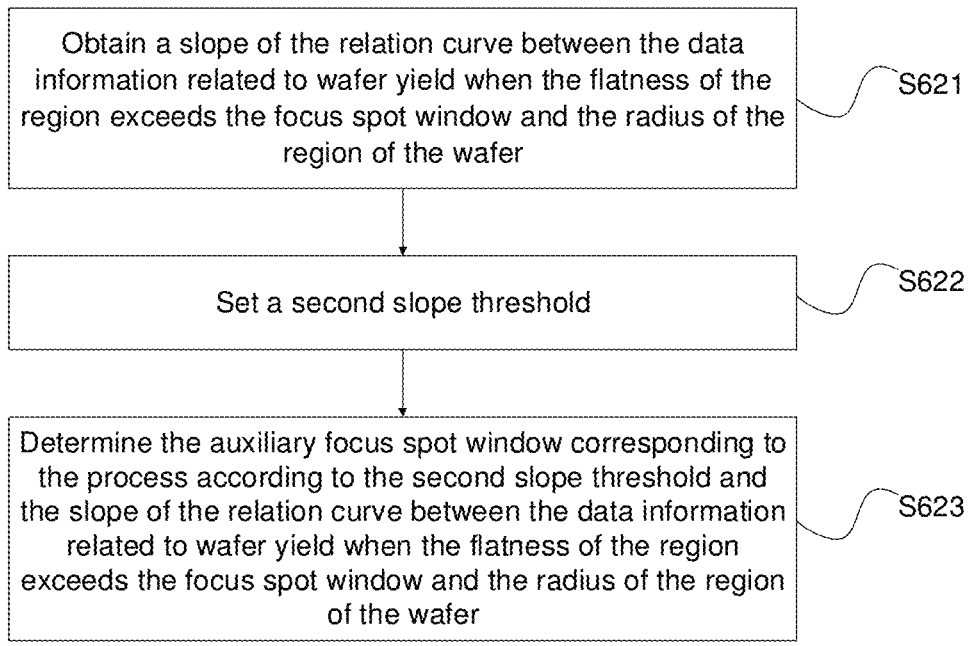
FIG. 7 is a schematic step flowchart of the method for determining a focus spot window of a wafer in still another exemplary embodiment of the present disclosure.

As shown in FIG. 7, in some embodiments of the present disclosure, step S620 includes:

Step S621, obtaining a slope of the relation curve between the data information related to wafer yield when the flatness of the region exceeds the focus spot window and the radius of the region of the wafer;

Step S622, setting a second slope threshold;

Step S623, determining the auxiliary focus spot window corresponding to the process according to the second slope threshold and the slope of the relation curve between the data information related to wafer yield when the flatness of the region exceeds the focus spot window and the radius of the region of the wafer.

In step S621, obtaining a slope of the relation curve between the data information related to wafer yield when the flatness of the region exceeds the focus spot window and the radius of the region of the wafer is obtained. In the present disclosure, the slope of the relation curve between the data information related to wafer yield and the radius of the region of the wafer refers to a tangent slope at a certain point on the curve. The tangent slopes at different points on the curve are different.

In step S622, a second slope threshold is set. The second slope threshold is a set slope limit value. This value may be set based on experience, and the specific value is not limited.

In step S623, the auxiliary focus spot window corresponding to the process is determined according to the second slope threshold and the slope of the relation curve between the data information related to wafer yield when the flatness of the region exceeds the focus spot window and the radius of the region of the wafer. In this step, once the second slope threshold is set, the auxiliary focus spot window can be determined according to the threshold combined with the change trend of the slope of the relation curve between the data information related to wafer yield and the radius of the region of the wafer.

In some embodiments of the present disclosure, the data information related to wafer yield is a wafer defect rate, and the second slope threshold is −1. When the slope of the relation curve between the data information related to wafer yield and the radius of the region of the wafer is equal to the second slope threshold, the radius of corresponding wafer region is the auxiliary focus spot window. As shown in FIG. 12, the slope of the curve at point D in the B process is −1, and the corresponding wafer region radius xd at this point is an auxiliary focus spot window. It should be noted here that different processes correspond to different relation curves, and different auxiliary focus spot windows can be correspondingly obtained through this step.

The method for determining a focus spot window of a wafer provided by the present disclosure can determine corresponding focus spot window for the process in the lithography technology, so that the focus spot control is more delicate in the entire process of semiconductor lithography technology. In addition, a focus spot window is determined for a specific process. When the wafer is abnormal in a certain process, the engineer can analyze the actual situation under the process and give a corresponding solution, such as rework, which may include re-process or die back cleaning, etc. The re-process refers to abolish the completed process and re-operate. For example, the photoresist that has been coated or developed is removed, and then the photoresist is coated or developed again. The die back cleaning refers to cleaning a die back during the re-process. For example, after the photoresist that has been coated or developed is removed, the die back is cleaned to remove fine particles that cause abnormal flatness. The method provided by the present disclosure can effectively avoid the influence on wafer yield in the subsequent manufacturing process.

The present disclosure further provides a method for determining whether a wafer needs to be reworked. In some embodiments of the present disclosure, a focus spot window is determined according to the above-mentioned method for determining a focus spot window of a wafer, the flatness of the focus spot window is compared with the flatness of a focus spot of the wafer, and whether the wafer needs to be reworked is judged according to the comparison result. Specifically, in the wafer lithography process, when the flatness of the focus spot is smaller than that of the focus spot window, it is determined that the wafer does not need to be reworked.

In other embodiments of the present disclosure, a focus spot window and an auxiliary focus spot window are determined according to the above-mentioned method for determining a focus spot window of a wafer, and whether the wafer needs to be reworked is judged according to the focus spot window, the auxiliary focus spot window and the focus spot of the wafer. Specifically, in the wafer lithography process, when the flatness of the focus spot is greater than the flatness of the focus spot window, and the radius of the focus spot is smaller than the radius of the auxiliary focus spot window, it is determined that the wafer needs to be reworked. When the flatness of the focus spot is greater than the flatness of the focus spot window, and the radius of the focus spot is greater than the auxiliary focus spot window, it is determined that the wafer does not need to be reworked. It should be noted here that, when it is determined that the wafer does not need to be reworked, the technician can determine whether to remove dies from the wafer according to the actual situation, that is, remove abnormal dies from the wafer. Specifically, the abnormal dies may be removed when the entire manufacturing process is completed in the wafer and the wafer is diced and packaged.

It should be noted that, although the various steps of the method in the present disclosure are described in a specific order in the drawings, this does not require or imply that these steps must be performed in the specific order, or that all the steps shown must be performed to achieve the desired result. Additionally or alternatively, some steps may be omitted, multiple steps may be combined into one step for execution, and/or one step may be decomposed into multiple steps for execution, etc., which should be regarded as a part of the present disclosure.

It should be understood that the present disclosure does not limit its application to the detailed structure and arrangement of components proposed in this specification. The present disclosure can have other embodiments, and can be implemented and executed in various ways. The aforementioned variations and modifications fall within the scope of the present disclosure. It should be understood that the present disclosure disclosed and defined in this specification extends to all alternative combinations of two or more individual features mentioned or obvious in the text and/or drawings. All these different combinations constitute multiple alternative aspects of the present disclosure. The embodiments of this specification illustrate the best way known for implementing the present disclosure, and will enable those skilled in the art to utilize the present disclosure.

The invention claimed is:

1. A method for determining a focus spot window of a wafer, comprising:
   acquiring flatness information and location information of a local region of the wafer before exposure;
   acquiring distribution information of abnormal dies, process information corresponding to the abnormal dies, and data information related to wafer yield; and
   determining a focus spot window corresponding to a process according to the flatness information and the location information of the local region of the wafer, the distribution information of the abnormal dies, the process information corresponding to the abnormal dies, and the data information related to wafer yield;
   wherein the data information related to wafer yield comprises a wafer yield test result map, wafer yield calculation methods, or wafer yield data values comprising a loss rate or a defect rate;
   wherein the determining a focus spot window corresponding to a process according to the flatness information and the location information of the local region of the wafer, the distribution information of the abnormal dies, the process information corresponding to the abnormal dies, and the data information related to wafer yield comprises:
      drawing a relation curve between the data information related to wafer yield and flatness of the local region of the wafer corresponding to the process according to the flatness information and the location information of the local region of the wafer, the distribution information of the abnormal dies, the process information corresponding to the abnormal dies, and the data information related to wafer yield; and
      determining the focus spot window corresponding to the process according to the relation curve between the data information related to wafer yield and the flatness of the local region of the wafer corresponding to the process.

2. The method for determining a focus spot window of a wafer of claim 1, wherein the acquiring distribution information of abnormal dies, process information corresponding to the abnormal dies, and data information related to wafer yield comprises:

acquiring a wafer yield information database, and acquiring the distribution information of the abnormal dies, the process information corresponding to the abnormal dies, and the data information related to wafer yield according to the wafer yield information database.

3. The method for determining a focus spot window of a wafer of claim 1, wherein the determining the focus spot window corresponding to the process according to the relation curve between the data information related to wafer yield and the flatness of the local region of the wafer corresponding to the process comprises:

obtaining a slope of the relation curve between the data information related to wafer yield and the flatness of the local region of the wafer corresponding to the process;

setting a first slope threshold; and determining the focus spot window corresponding to the process according to the first slope threshold and the slope of the relation curve between the data information related to wafer yield and the flatness of the local region of the wafer.

4. The method for determining a focus spot window of a wafer of claim 3, wherein the data information related to wafer yield is a wafer defect rate, and the first slope threshold is 1; when the slope of the relation curve between the data information related to wafer yield and the flatness of the local region of the wafer is equal to the first slope threshold, the flatness of the local region of the wafer is the focus spot window.

5. A method for determining a focus spot window of a wafer, comprising:

acquiring flatness information and location information of a local region of the wafer before exposure;

acquiring distribution information of abnormal dies, process information corresponding to the abnormal dies, and data information related to wafer yield;

determining a focus spot window corresponding to a process according to the flatness information and the location information of the local region of the wafer, the distribution information of the abnormal dies, the process information corresponding to the abnormal dies, and the data information related to wafer yield;

acquiring radius information of a region of the wafer;

acquiring data information related to wafer yield when flatness of the region exceeds the focus spot window and distribution information of the abnormal dies under the process; and determining an auxiliary focus spot window corresponding to the process according to the radius information of the region of the wafer, the data information related to wafer yield when the flatness of the region exceeds the focus spot window, and the distribution information of the abnormal dies under the process;

wherein the data information related to wafer yield comprises a wafer yield test result map, wafer yield calculation methods, or wafer yield data values comprising a loss rate or a defect rate.

6. The method for determining a focus spot window of a wafer of claim 5, wherein the acquiring radius information of a region of the wafer comprises:

obtaining the flatness and corresponding coordinate information of the region of the wafer before the exposure; and acquiring the radius information of the region of the wafer according to the corresponding coordinate information.

7. The method for determining a focus spot window of a wafer of claim 5, wherein the determining an auxiliary focus spot window corresponding to the process according to the radius information of the region of the wafer, the data information related to wafer yield when the flatness of the region exceeds the focus spot window, and the distribution information of the abnormal dies under the process comprises:

drawing a relation curve between the data information related to wafer yield when the flatness of the region exceeds the focus spot window and a radius of the region of the wafer corresponding to the process, according to the radius information of the region of the wafer, the data information related to wafer yield when the flatness of the region exceeds the focus spot window, and the distribution information of the abnormal dies; and determining the auxiliary focus spot window corresponding to the process according to the relation curve between the data information related to wafer yield when the flatness of the region exceeds the focus spot window and the radius of the region of the wafer.

8. The method for determining a focus spot window of a wafer of claim 7, wherein the determining the auxiliary focus spot window corresponding to the process according to the relation curve between the data information related to wafer yield when the flatness of the region exceeds the focus spot window and the radius of the region of the wafer comprises:

obtaining a slope of the relation curve between the data information related to wafer yield when the flatness of the region exceeds the focus spot window and the radius of the region of the wafer;

setting a second slope threshold; and determining the auxiliary focus spot window corresponding to the process according to the second slope threshold and the slope of the relation curve between the data information related to wafer yield when the flatness of the region exceeds the focus spot window and the radius of the region of the wafer.

9. The method for determining a focus spot window of a wafer of claim 8, wherein the data information related to wafer yield when the flatness of the region exceeds the focus spot window is a wafer defect rate, and the second slope threshold is −1; when the slope of the relation curve between the data information related to wafer yield when the flatness of the region exceeds the focus spot window and the radius of the region of the wafer is equal to the second slope threshold, the radius of the region of the wafer is the auxiliary focus spot window.

10. The method for determining a focus spot window of a wafer of claim 1, wherein the distribution information of the abnormal dies comprises a number of abnormal dies and location information of the abnormal dies.

11. A method for determining whether a wafer needs to be reworked, comprising determining the focus spot window according to the method for determining a focus spot window of a wafer of claim 1, comparing flatness of the focus spot window with flatness of a focus spot of the wafer to obtain a comparison result, and judging whether the wafer needs to be reworked according to the comparison result.

12. The method for determining whether a wafer needs to be reworked of claim 11, comprising, when the flatness of the focus spot is smaller than the flatness of the focus spot window, determining that the wafer does not need to be reworked.

13. A method for judging whether a wafer needs to be reworked, comprising determining the focus spot window and the auxiliary focus spot window according to the method for determining a focus spot window of a wafer of claim 5, and judging whether the wafer needs to be reworked according to the focus spot window, the auxiliary focus spot window, and a focus spot of the wafer.

14. The method for determining whether a wafer needs to be reworked of claim 13, comprising, when flatness of the focus spot is greater than flatness of the focus spot window, and a radius of the focus spot is smaller than the auxiliary focus spot window, determining that the wafer needs to be reworked.

15. The method for determining whether a wafer needs to be reworked of claim 13, comprising, when the flatness of the focus spot is greater than the flatness of the focus spot window, and a radius of the focus spot is greater than a radius of the auxiliary focus spot window, determining that the wafer does not need to be reworked.

\* \* \* \* \*